(12) United States Patent
Guo et al.

(10) Patent No.: US 9,041,057 B2
(45) Date of Patent: May 26, 2015

(54) FIELD EFFECT TRANSISTOR DEVICE WITH SHAPED CONDUCTION CHANNEL

(75) Inventors: Dechao Guo, Wappingers Falls, NY (US); Shu-Jen Han, Cortlandt Manor, NY (US); Chung-Hsun Lin, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 342 days.

(21) Appl. No.: 13/551,164

(22) Filed: Jul. 17, 2012

(65) Prior Publication Data

US 2012/0280279 A1    Nov. 8, 2012

Related U.S. Application Data

(62) Division of application No. 12/860,977, filed on Aug. 23, 2010, now Pat. No. 8,309,418.

(51) Int. Cl.
| | |
|---|---|
| *H01L 29/78* | (2006.01) |
| *H01L 29/10* | (2006.01) |
| *H01L 29/165* | (2006.01) |
| *H01L 29/423* | (2006.01) |
| *H01L 29/66* | (2006.01) |

(52) U.S. Cl.
CPC ............ *H01L 29/78* (2013.01); *H01L 29/1037* (2013.01); *H01L 29/1054* (2013.01); *H01L 29/165* (2013.01); *H01L 29/4236* (2013.01); *H01L 29/66621* (2013.01)

(58) Field of Classification Search
None
See application file for complete search history.

(56) References Cited

U.S. PATENT DOCUMENTS

| | | | |
|---|---|---|---|
| 6,171,916 B1 | 1/2001 | Sugawara et al. | |
| 6,358,800 B1 | 3/2002 | Tseng | |
| 2003/0068864 A1 | 4/2003 | Il-Yong et al. | |
| 2004/0132256 A1 | 7/2004 | Kim et al. | |
| 2005/0090066 A1 | 4/2005 | Zhu et al. | |
| 2007/0184614 A1 | 8/2007 | Adkisson et al. | |
| 2008/0142835 A1* | 6/2008 | Peidous et al. | 257/190 |
| 2008/0203428 A1 | 8/2008 | Choi | |
| 2009/0114949 A1 | 5/2009 | Hebert | |
| 2011/0241093 A1* | 10/2011 | Wu | 257/302 |

* cited by examiner

*Primary Examiner* — Matthew W Such
*Assistant Examiner* — Abul Kalam
(74) *Attorney, Agent, or Firm* — Cantor Colburn LLP; Vazken Alexanian

(57) ABSTRACT

A field effect transistor device includes a substrate, a silicon germanium (SiGe) layer disposed on the substrate, gate dielectric layer lining a surface of a cavity defined by the substrate and the silicon germanium layer, a metallic gate material on the gate dielectric layer, the metallic gate material filling the cavity, a source region, and a drain region.

6 Claims, 4 Drawing Sheets

FIELD EFFECT TRANSISTOR DEVICE WITH SHAPED CONDUCTION CHANNEL

CROSS-REFERENCE TO RELATED APPLICATIONS

This is a divisional application of application Ser. No. 12/860,977, filed Aug. 23, 2010, now U.S. Pat. No. 8,309,418.

FIELD OF INVENTION

The present invention relates to semiconductor field effect transistors.

DESCRIPTION OF RELATED ART

Planar field effect transistor (FET) devices include a gate stack disposed on a channel region of a substrate and source and drain regions disposed adjacent to the gate. The gate stack includes a gate dielectric layer or inversion layer having a thickness (Tinv). In a planar FET, the gate has a length that may be defined as a distance between the source and drain regions, i.e., the conductive length of the channel region.

A number of planar FETs may be grouped on a substrate; the distance between the gates of the FETs or pitch, becomes smaller as the scale of the FETs are reduced. The reduction in pitch affects the gate length and electrostatic properties of the devices.

BRIEF SUMMARY

In one aspect of the present invention, a field effect transistor device includes a substrate, a silicon germanium (SiGe) layer disposed on the substrate, gate dielectric layer lining a surface of a cavity defined by the substrate and the silicon germanium layer, a metallic gate material on the gate dielectric layer, the metallic gate material filling the cavity, a source region, and a drain region.

In another aspect of the present invention, a field effect transistor device includes a substrate, a silicon germanium (SiGe) layer disposed on the substrate, gate dielectric layer lining a surface of a cavity defined by the substrate and the silicon germanium layer, a metallic gate material on the gate dielectric layer, the metallic gate material filling the cavity, a source region, and a drain region, wherein the SiGe layer includes a graduated proportion of germanium (Ge) to silicon (Si) such that a proportion of Ge to Si in a region of the SiGe layer adjacent to the substrate is lower than a proportion of Ge to Si in a region of the SiGe layer proximate to the source and drain regions.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2-9 illustrate an exemplary method for fabricating the device of FIG. 1, in which:

FIG. 2 illustrates a graded layer formed on a substrate;
FIG. 3 illustrates the formation of a cavity;
FIG. 4 illustrates the formation of a gate dielectric layer;
FIG. 5 illustrates the removal of portions of the gate dielectric layer and a metallic gate material;
FIG. 6 illustrates the formation of spacers;
FIG. 7 illustrates the formation of doped regions;
FIG. 8 illustrates an implantation of ions; and
FIG. 9 illustrates the formation of a layer.

DETAILED DESCRIPTION

Figure 1:
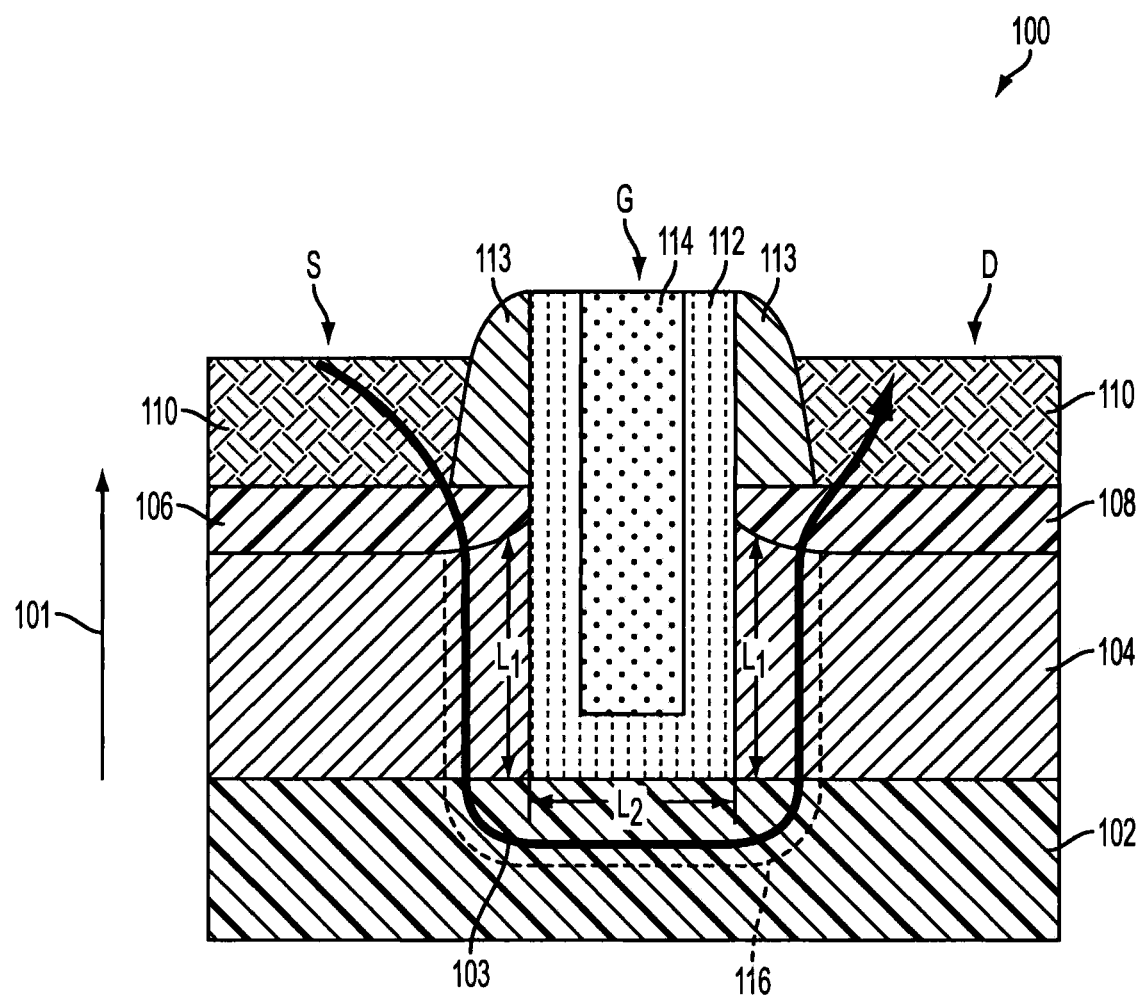
FIG. 1 illustrates a side cut-away view of an exemplary embodiment of a field effect transistor (FET) device.

FIG. 1 illustrates a side cut-away view of an exemplary embodiment of a field effect transistor (FET) device 100. The device 100 includes a layer 104 that may include graded silicon germanium (SiGe), uniform SiGe, Si, or another semiconductor material disposed on a substrate 102. The substrate 102 may include, for example, a layer of silicon, SiGe, or a silicon on insulator (SOI) layer. The graded SiGe layer has a graduated density of the proportion of Ge to Si such that the proportion of Ge to Si is lower in the region of the layer 104 adjacent to the substrate 102 and the proportion gradually increases in the direction of the arrow 101. The graded SiGe is formed by an epitaxial growth process. The ratio of Ge to Si ranges from 5% of Ge to Si at the bottom of layer 104 to higher percentage at the top of layer 104 (where the top of the layer 104 is indicated by the direction of the arrow 101). In alternate embodiments the SiGe layer may have a uniform Ge to Si ratio from the bottom of layer 104 to the top of the layer 104, with the thickness of layer 104 thinner than the critical thickness of the device 100. The layer 104 includes doped regions 106 and 108 that may be implanted with ions such as, for example p-type and/or n-type ions, that form portions of a source region (S) and a drain region (D). The source and drain regions are further defined by a layer 110 that may include for example, p-type and/or n-type doped epitaxially grown silicon material, or another type of suitable material. The substrate 102 and the layer 104, and a spacer 113 define a cavity that is lined with a gate dielectric layer 112 that may include for example, a high-k or silicon dioxide material. A metallic gate material 114 is disposed on the gate dielectric layer 112 and fills the remainder of the cavity. The metallic gate material 114 defines a gate region (G) and may include, for example, titanium nitride, tantalum nitride, or tantalum silicon nitride. The spacer 113 may include, for example, an oxide or silicon nitride material.

A channel region 116 of the device is illustrated by the dashed line in FIG. 1. The distance ($L_1$) between the doped regions 106 and 108 of the layer 104 and the substrate 102 and the distance ($L_2$) that includes the width of the metallic gate material 114 and the gate dielectric layer 112 define the length (L) of the channel region 116 of the device 100, where $L=(2*L_1+L_2)$. The line 103 illustrates the conduction path of the device 100 through the channel region 116.

Figure 2:
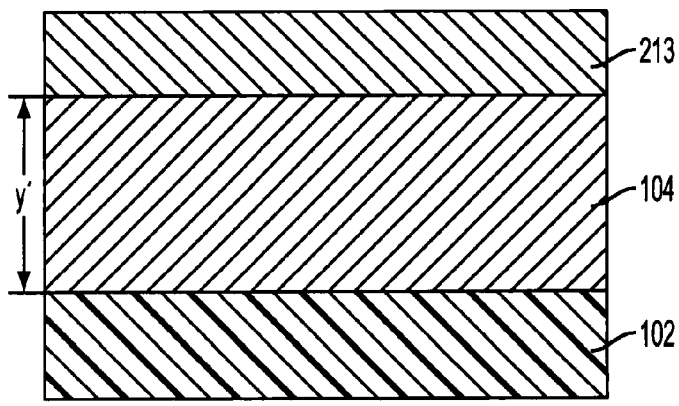

FIGS. 2-9 illustrate an exemplary method for fabricating the device 100 (of FIG. 1). Referring to FIG. 2, the graded layer 104 having a thickness (y') is formed on a substrate 102. The substrate 102 may include, for example, a silicon or silicon on insulator (SOI) material. The graded layer 104 is formed by an epitaxial growth process. A layer of spacer material 213 is formed on the layer 104. The spacer material 213 may include, for example, silicon oxide or silicon nitride material.

Figure 3:
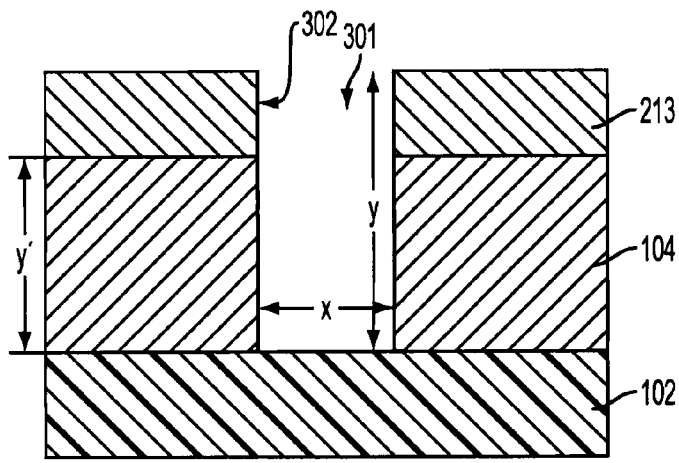

FIG. 3 illustrates the resultant structure following the formation of a cavity 301 having an exposed inner surface 302 defined by the substrate 102, the layer 104, and the spacer material 213, that exposes the substrate 102. The cavity has a depth (y) and a width (x). The cavity 301 may be formed by, for example, patterning and etching using a reactive ion etching (RIE) or other suitable etching process to form the cavity 213. The etching process may, for example, selectively etch the layer 104, or be timed such that a minimal amount of the substrate 102 material is removed.

The dimensions $L_1$ and $L_2$ that define the length of the channel region 116 of the device 100 (of FIG. 1) are partially defined by the depth y and width x of the channel 301 (of FIG. 3) respectively. The thickness (y') of the layer 104 may be increased or decreased (thereby increasing or decreasing the cavity depth y) to meet the desired channel length L of the device 100. Likewise, the channel width x may be increased or decreased to increase or decrease $L_2$. Thus, the channel length L may also be defined as being approximately equal to (2y'+x).

Figure 4:
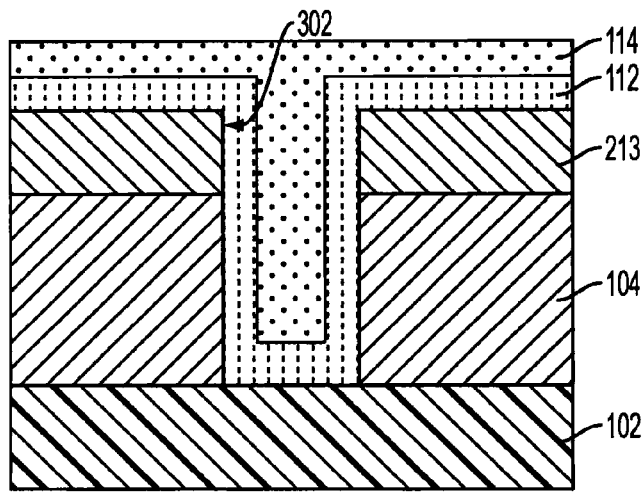

FIG. 4 illustrates the formation of a gate dielectric layer 112 that lines the surface 302 of the cavity 301 (of FIG. 3) and on the spacer material 213, and the formation of a metallic gate material 114 on the gate dielectric layer 112 that fills the remainder of the cavity 301. The gate dielectric layer 112 and metallic gate material may be formed by, for example a chemical vapor deposition (CVD) process, an atomic layer deposition (ALD), or a physical vapor deposition (PVD).

Figure 5:
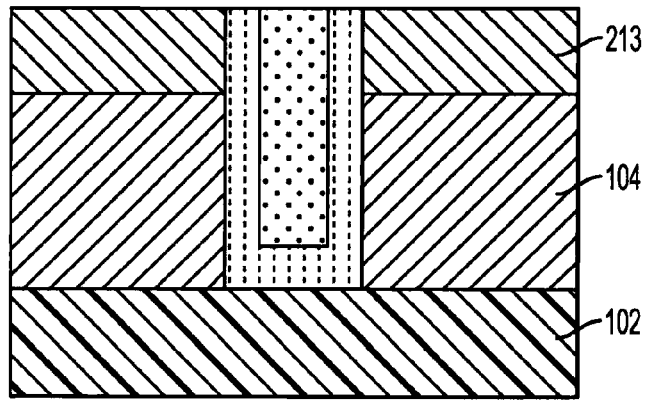

FIG. 5 illustrates the resultant structure following the removal of portions of the gate dielectric layer 112 and the metallic gate material 114 to expose the spacer material 213. The gate dielectric layer 112 and the metallic gate material 114 may be removed by, for example, a chemical mechanical polishing (CMP) or other suitable process.

Figure 6:
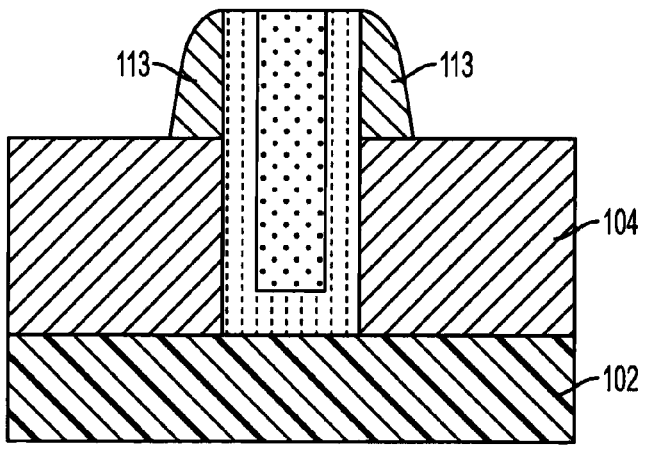

FIG. 6 illustrates the formation of spacers 113 from the spacer material 213. The spacers 113 may be formed by, for example, a patterning and etching process such as RIE that removes portions of the spacer material 213 to expose portions of the layer 104 and define the spacers 113.

Figure 7:
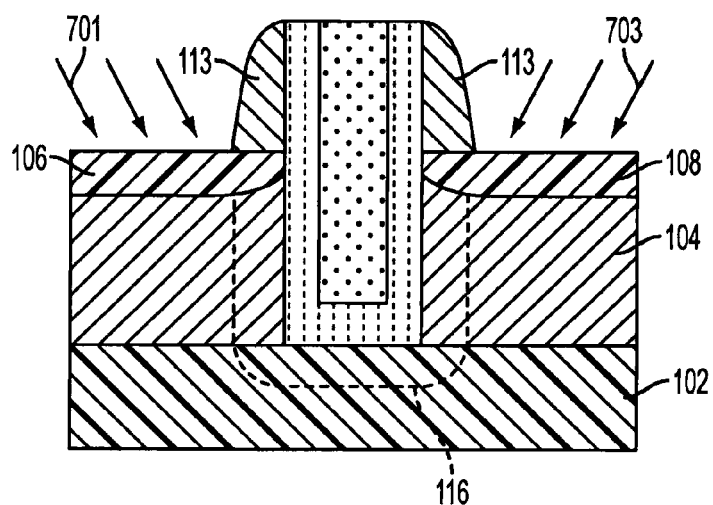

FIG. 7 illustrates the implantation of ions to form the doped regions 106 and 108 in the layer 104. The ions may include n-type and/or p-type ions that may be implanted at an angle as shown by the arrows 701 and 703. An angled implantation method allows the doped regions 106 and 108 to extend under the spacer 113.

Figure 8:
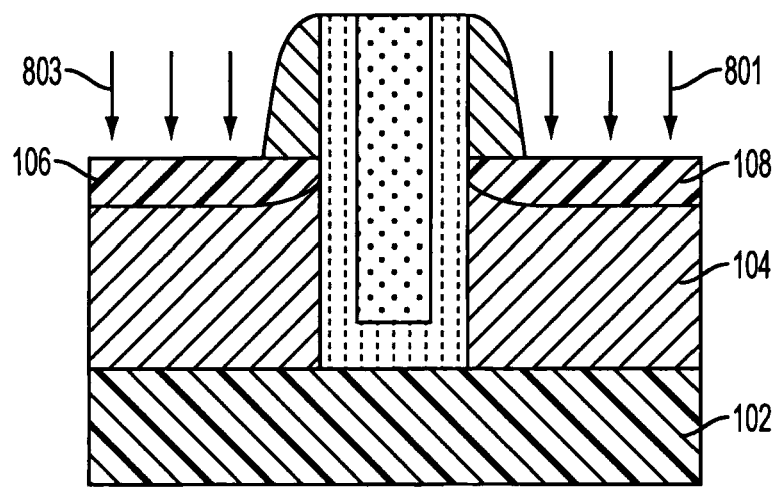

FIG. 8 illustrates an optional implantation of ions in the doped regions 106 and 108 that may be implanted, for example, along the vertical lines 803 and 801 to further imbed n-type and/or p-type ions in the doped regions 106 and 108.

Figure 9:
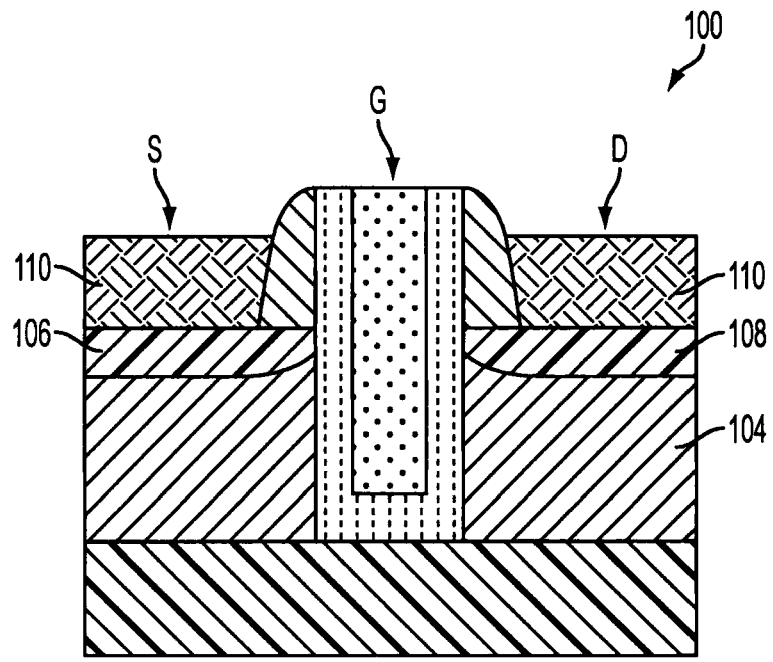

FIG. 9 illustrates the formation of a layer 110 to form the device 100. The layer 110 may include, for example, epitaxially grown silicon material or silicon material formed from another process. The layer 110 may be doped with ions in-situ (i.e., during the epitaxial growth), or following the growth of the silicon material, using an ion implantation method.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention, and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field effect transistor device comprising:
a substrate;
a silicon germanium (SiGe) layer disposed on the substrate;
a gate dielectric layer lining a surface of a cavity defined by the substrate and the silicon germanium layer;
a metallic gate material on the gate dielectric layer, the metallic gate material filling the cavity;
ion doped regions disposed in an upper surface of the SiGe layer;
a silicon layer disposed on the ion doped regions of the SiGe layer;
spacers disposed on the ion doped regions of the SiGe layer, the spacers having an outside surface abutting the silicon layer, the spacers further defining the cavity, and the gate dielectric layer lining an entire inside surface of the spacers;
a source region; and
a drain region, wherein the source and drain regions comprise both the silicon layer and the ion doped regions such that a channel length, L, is defined by a distance $L=(2*L_1+L_2)$, wherein $L_1$ is a distance between the ion doped regions and the substrate, and $L_2$ is a distance comprising a width of the metallic gate material and the gate dielectric layer.

2. The device of claim 1, wherein the SiGe layer includes a graduated proportion of germanium (Ge) to silicon (Si) such that a proportion of Ge to Si in a region of the SiGe layer adjacent to the substrate is lower than a proportion of Ge to Si in a region of the SiGe layer proximate to the source and drain regions.

3. The device of claim 1, wherein the silicon layer is an epitaxially grown doped silicon material.

4. The device of claim 1, wherein the substrate includes a silicon material.

5. A field effect transistor device comprising:
a substrate;

a silicon germanium (SiGe) layer disposed on the substrate;

a gate dielectric layer lining a surface of a cavity defined by the substrate and the silicon germanium layer, a bottom surface of the gate dielectric layer being coplanar with a top surface of the substrate;

a metallic gate material on the gate dielectric layer, the metallic gate material filling the cavity;

ion doped regions disposed in an upper surface of the SiGe layer;

a silicon layer disposed on the ion doped regions of the SiGe layer;

spacers disposed on the ion doped regions of the SiGe layer, the spacers having an outside surface abutting the silicon layer, the spacers further defining the cavity, and the gate dielectric layer lining an entire inside surface of the spacers;

a source region; and a drain region, wherein the source and drain regions comprise both the silicon layer and the ion doped regions such that a channel length, L, is defined by a distance $L=(2*L_1+L_2)$, wherein $L_1$ is a distance between the ion doped regions and the substrate, and $L_2$ is a distance comprising a width of the metallic gate material and the gate dielectric layer; and wherein the SiGe layer includes a graduated proportion of germanium (Ge) to silicon (Si) such that a proportion of Ge to Si in a region of the SiGe layer adjacent to the substrate is lower than a proportion of Ge to Si in a region of the SiGe layer proximate to the source and drain regions.

6. The device of claim 5, wherein the silicon material is an epitaxially grown doped silicon material.

* * * * *